United States Patent [19]

Samarov

[11] Patent Number: 5,146,981
[45] Date of Patent: Sep. 15, 1992

[54] SUBSTRATE TO HEATSINK INTERFACE APPARATUS AND METHOD

[75] Inventor: Victor M. Samarov, Carlisle, Mass.

[73] Assignee: Digital Equipment Corporation, Maynard, Mass.

[21] Appl. No.: 792,128

[22] Filed: Nov. 14, 1991

[51] Int. Cl.⁵ .................................................. F28F 7/00
[52] U.S. Cl. ..................... 165/185; 361/386; 361/387; 29/890.035; 174/16.3
[58] Field of Search .............. 165/80.2, 80.4, 185; 174/16.3; 361/386, 387; 29/890.035

[56] References Cited

U.S. PATENT DOCUMENTS

| | | | |
|---|---|---|---|
| 3,405,323 | 10/1968 | Surty et al. | 361/381 |
| 4,069,498 | 1/1978 | Joshi | 357/81 |
| 4,092,697 | 5/1978 | Spaight | 361/386 |
| 4,193,445 | 3/1980 | Chu et al. | 165/79 |
| 4,254,431 | 3/1981 | Babuka et al. | 357/82 |
| 4,462,462 | 7/1984 | Meagher et al. | 165/80.4 |
| 4,498,119 | 2/1985 | Cronin | 361/386 |
| 4,561,011 | 12/1985 | Kohara et al. | 357/81 |
| 4,639,829 | 1/1987 | Ostergren et al. | 361/386 |
| 4,682,269 | 7/1987 | Pitasi | 361/386 |
| 4,794,981 | 1/1989 | Mizuno | 165/80.4 |
| 4,879,632 | 11/1989 | Yamamoto et al. | 361/386 |
| 4,965,699 | 10/1990 | Jorden et al. | 361/387 |
| 4,974,119 | 11/1990 | Martin | 361/386 |
| 5,012,858 | 5/1991 | Natori et al. | 165/1 |

OTHER PUBLICATIONS

"Structure for the Removal of Heat From an I.C. Module", by A. J. Arnold IBM TDB vol. 22 #6 Nov. 1979 pp. 2294-2295.

Primary Examiner—Allen J. Flanigan
Attorney, Agent, or Firm—Dirk Brinkman, Ronald E. Myrick, Barry N. Young

[57] ABSTRACT

A cooling apparatus for a substrate with heat generating circuit devices mounted on a first side thereof. A second side of the substrate is coated with a first layer made of a releasing agent. A second layer made of a thermally conductive material having a low melting point is provided on the first layer. A heat sink is provided on the second layer, for radiating heat transmitted from the circuit device through the substrate, the first layer and the second layer. During the assembly, the apparatus is heated and compressed to reflow the second layer reducing any air pocket formed at the substrate-to-heatsink interface.

16 Claims, 4 Drawing Sheets

SUBSTRATE TO HEATSINK INTERFACE APPARATUS AND METHOD

FIELD OF THE INVENTION

This invention relates to cooling a heat generating circuit device mounted on a substrate, and more particularly to a cooling apparatus having a stress free, thermally conductive interface between the substrate and a removable heatsink.

BACKGROUND OF THE INVENTION

A very significant limitation on the operation of an integrated circuit device is the efficient extraction of heat. Unless the circuit device is provided with an efficient heat transfer mechanism to maintain it within a predetermined operating temperature range, the speed and power of the device are severely limited. Excessive overheating of the integrated circuit device may cause its destruction.

The problem of heat removal from an integrated circuit device is increased when the device is mounted on a supporting substrate with solder terminals for connecting the device to electrically conductive traces on the substrate. In such a solder bonded device the major portion of the heat is usually removed from the back side of the device, through the substrate, to a heat exchanger in thermal contact with the substrate. The introduction of very large scale integration circuit devices, and the dense placement of a plurality of such devices on a single multi-layer, or "thick film," ceramic substrate has significantly increased the heat flux to be removed.

In typical prior art cooling systems, a heatsink has been placed in thermal contact with the surface of the substrate having no circuit devices. A gaseous or liquid coolant circulating over or through the heatsink has been used to dissipate heat from the heatsink. To prevent malfunction of the devices, it is critically necessary that there be intimate contact between the substrate and the heatsink, without clearances therebetween.

However, natural warpage in the substrate cause air pockets at the substrate-to-heatsink interface which interfere with the efficient flow of heat from the substrate to the heatsink. In prior art cooling systems the air pockets have been reduced by tightly coupling the substrate to the heatsink by adhesives or mechanical connecting means. However, any mismatch between the thermal expansion characteristics of the substrate and that of the heatsink will stress an adamantine connection. Shear stresses, which occur during the natural heating cycles of the devices, will eventually cause fatigue in the substrate which can ultimately lead to fractures of the brittle substrate, and failure of the devices mounted thereon.

In addition, it is desirable to allow for the repair of the devices mounted on the substrate. Therefore, the heatsink should be easily removable. The traditional solutions include the use of adhesives, gaskets, and thermal greases at the substrate-to-heatsink interface.

The main disadvantage of solutions which comprise adhesives is that even for flexible adhesives a relatively strong bond is formed between the substrate and heatsink. The rigidity of the adhesive bond increases the risk of cyclical stress related fatigue failures. Furthermore, although adhesives comply well with the surface irregularities of the substrate, they are generally poor thermal conductors and contribute to the overall thermal resistance at the substrate-to-heatsink interface. In addition, adhesion bonding techniques require expensive dispensing equipment, cumbersome curing chambers, and do not easily permit the removal of the heatsink to repair the devices on the substrate.

Solutions which include gasket type of materials are easier to install than adhesives, and generally produce stress free mating at the substrate-to-heatsink interface. However, gasket type materials almost totally lack compliance necessary to compensate for the unevenness of the substrate, and also, the thermal conductivity of gaskets is relatively poor.

Greases are similar in thermal performance to adhesives, that is relatively poor, but greases have the advantage that they produce stress free mating at the substrate-to-heatsink interface. Also greases conform well to surface irregularities in the substrate, thus minimizing the formation of air pockets at the interface. However, greases tend to migrate or flow away from the interface, decreasing, over time, their effectiveness as a mating material, and like adhesives, greases require dispensing equipment.

Accordingly, the known solutions for thermally mating a substrate to a heatsink increase the cost of assembly, and moreover, do not always guarantee a stress free, thermally efficient interface, decreasing the overall performance and reliability of the integrated circuit devices.

Therefore, it is desirable to provide an apparatus and method for reliably mating a substrate to a heatsink which allows for the removal of the heatsink for repair of the circuit devices, which is simple to assemble, and which uses readily available inexpensive materials that have good thermal conductive characteristics.

SUMMARY OF THE INVENTION

In accordance with one aspect of the invention, there is provided a cooling apparatus which overcomes the foregoing disadvantages of the prior art. The apparatus includes a substrate with at least one heat generating circuit device mounted on a first side thereof. The second side of the substrate is coated with a first layer made of a releasing agent for providing the substrate with a non-stick surface. A second layer made of a thermally conductive material having a low melting point is provided on the first layer, for creating a mechanically conforming interface. A heat sink is provided on the second layer, for radiating heat transmitted from the circuit device through the substrate, the first layer and the second layer.

According to another aspect, the present invention provides a method of cooling at least one heat generating circuit device mounted on a first side of a substrate. The method includes the steps of: coating a second side of the substrate with a first layer of material made of a releasing agent for creating a non-stick surface on the substrate; placing a second layer of material having a low melting point on the first layer; placing a heatsink on the second layer; heating the second layer while compressing the substrate and heatsink together to reflow the second layer; and cooling the second layer to form a conformal interface between the substrate and the heatsink.

These and other features and advantages of the present invention will become apparent from a reading of the detailed description in conjunction with the attached drawings in which like reference numerals refer to like elements in the several views.

DETAILED DESCRIPTION

Figure 1:
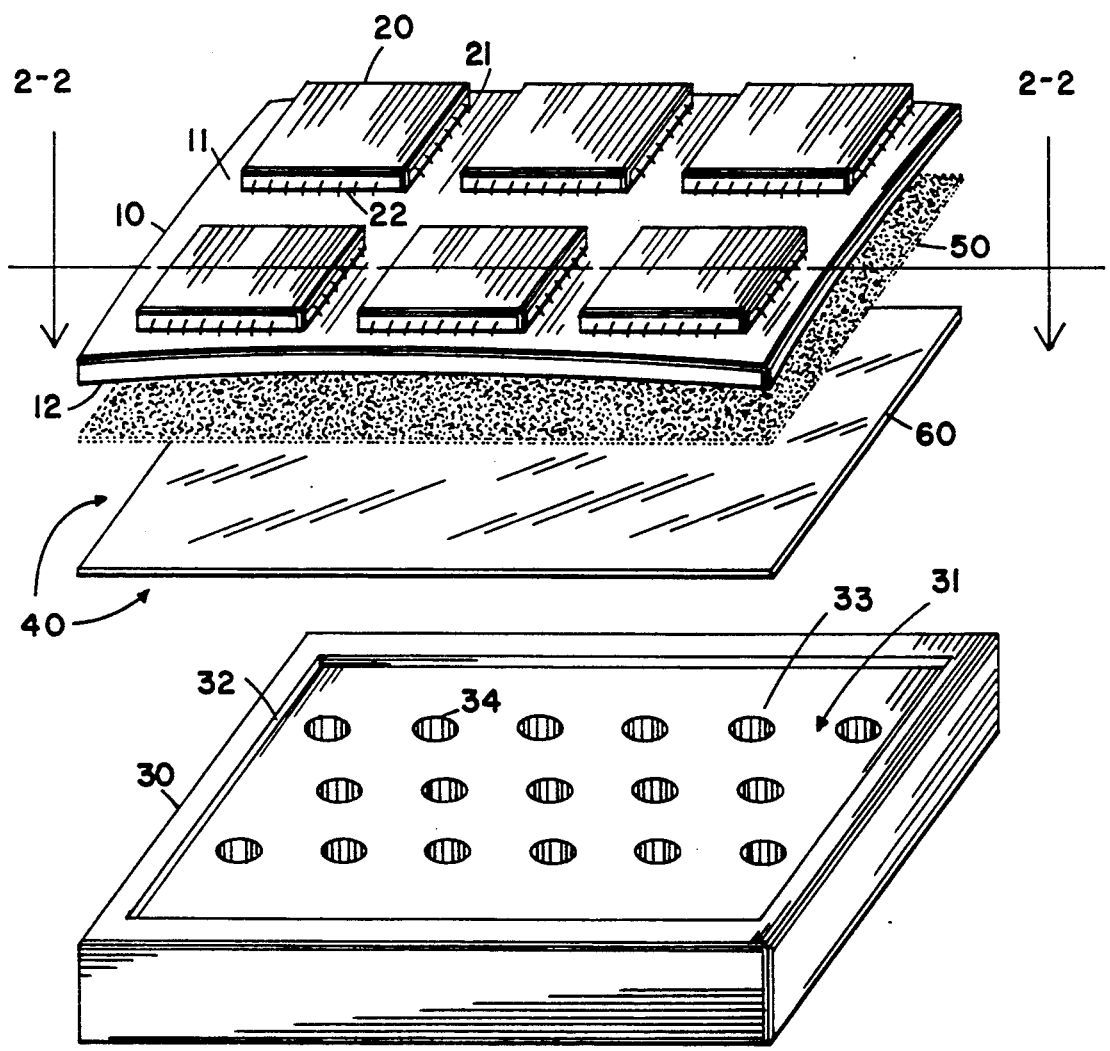
FIG. 1 is an exploded perspective view of the apparatus according to the present invention.

Now, with reference to the drawings, in FIG. 1 there is shown a rectangularly shaped substrate 10 with a first surface 11 and a second surface 12. A plurality of heat generating components, including an integrated circuit device 20, are mounted on the first surface 11 of the substrate 10 by means of electrically conductive terminals 21. The terminals 21 are soldered to circuit traces, not shown, etched on, or in the substrate 10.

The operation of the circuit device 20 produces heat which must be removed to prevent the failure or destruction of the device 20. Heat is most conveniently removed from the backside 22 of the device 20 through the substrate 10. Therefore, it is advantageous to form the substrate 10 of a thermally conductive dielectric material, by way of example, a multi-layer, or "thick film," ceramic made of aluminum oxide.

Excess heat from the substrate 10 is removed by a heatsink 30 in intimate thermal relationship with the second surface 12 of the substrate 10. For reasons that will become apparent, the second surface 12 of the substrate is coated with a first, thin layer of a releasing agent 50. Also a second layer, in the form of a sheet 60 made of a thermally conductive low melting point material is placed between the substrate 10 and the heatsink 30. Also, a shallow relief 31 having side walls 32 and interior surface 33, and a plurality of throughholes 34 are formed in the heatsink 30. The relief 31 has a lateral extent slightly larger than that of the substrate 10 and sheet 60. The surface 33 of the heatsink 30 inside the relief 31 is made substantially flat. The heatsink 30 is formed of an inexpensive, extrudable or die cast metal with good thermal conductive characteristics, for example, aluminum.

Figure 2:
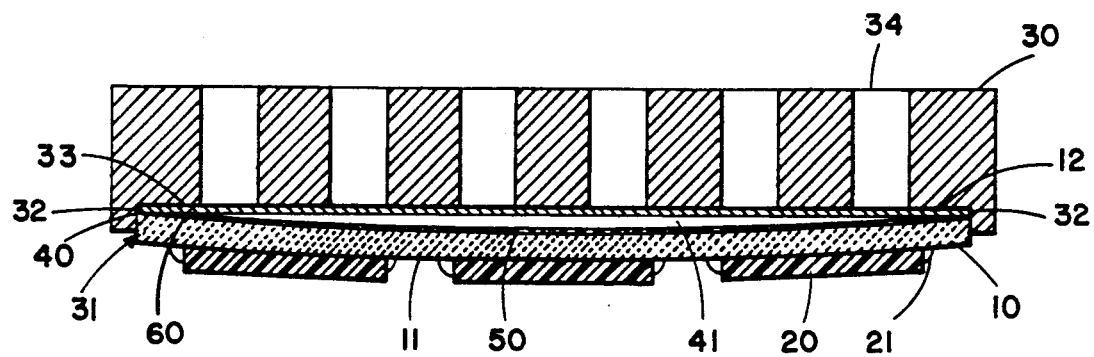
FIG. 2 is a cross-sectional view of the apparatus of FIG. 1 prior to assembly taken along line 1—1.

To minimize the thermal resistance at the substrate-to-heatsink interface, generally indicated by numeral 40 in FIG. 1, the second surface 12 of the substrate 10 must be in continuous and intimate thermal contact with the surface 33 of the heatsink 30. However, natural warpage is induced into the substrate 10 during the firing of the ceramic. That is, during firing, the substrate 10 tends to flex, and assumes a domed shaped profile, as shown in FIG. 2. Therefore, when the domed second surface 12 of the substrate 10 is mated with the substantially flat surface 33 of the heatsink 30 an air pocket 40, as indicated in FIG. 2, forms at the substrate-to-heatsink interface 40, interfering with the conduction of heat from the substrate 10 to the heatsink 30. The domed substrate 10 may deviate from that of a truly planar surface by as much as several mils at the point where the flexing is the greatest. Generally, if the deviation is greater than 5 mils (0.005″) the substrate is rejected as scrap.

Although the substrate 10 and the heatsink 30 could be intimately bonded to one and another by adhesive or mechanical connecting means, such as screws, to reduce the air pocket under the domed substrate 10, the different coefficients of thermal expansion of the substrate 10 and heatsink 30 will, over time, cause stress-related fractures in the brittle substrate 10 because of the cyclical heating and cooling of the circuit device 20. Also, to facilitate the repair of the device 20, it would be advantageous to make the heatsink 30 removable.

Therefore, in accordance with the present invention, and as more clearly shown in FIG. 2, the substrate-to-heatsink interface 40 is constructed to be stress free, mechanically conforming, removable, and thermally conductive by reducing the air pocket 41. During assembly, for reasons that will become apparent, the apparatus is oriented with the component side of the substrate 10 facing down, as shown in FIG. 2.

The second surface 12 of the substrate 10 is coated with the first, thin layer of a releasing agent 50 during the assembly of the apparatus. The releasing agent 50, may be sprayed onto the second surface 12 in the form of an aerosol fluid. Suitable releasing agents 50 are a fluoroplastic resin such as "TEFLON," manufactured by DuPont DeNemours EI & Company, Wilmington, DE., or silicone. The thin coating of the releasing agent 50, for example in the range of 1-2 microns, provides the substrate 10 with a non-stick surface 12.

In addition, the substrate-to-heatsink interface 40 is provided with a second layer in the form of the rectangularly shaped sheet 60 made of a low melting point alloy. The lateral extent of the sheet 60 is substantially the same as that of the substrate 10. The thickness of the sheet is in the range of 0.012 to 0.020 inches. A suitable alloy is the eutectic metal "LMA-255," made by the Indium Corporation of America, Utica, N.Y., consisting of 55.5% bismuth and 44.5% lead. This alloy has a melting temperature at 255 degrees Fahrenheit, well above the operating temperature of the apparatus, yet below the melting temperature of the solder joints of terminals 21, nominally greater than 300 degrees Fahrenheit. The alloy of sheet 60 also exhibits minimal dimensional contraction and expansion on liquefaction and soldification.

After the releasing agent 50 has been coated on the second surface 12 of the substrate 10, and the sheet 60 is placed in the relief 31, between the substrate 10 and the heatsink 30. The entire apparatus is heated to a temperature above the melting point of the metal alloy, but below the melting point of the terminal's 21 solder joints. Simultaneously while being heated, the substrate 10 and heatsink 30 are lightly squeezed together with a conventional fixture, not shown, loading the molten sheet 60 to a pressure of approximately 1 pound per square inch.

Figure 3:
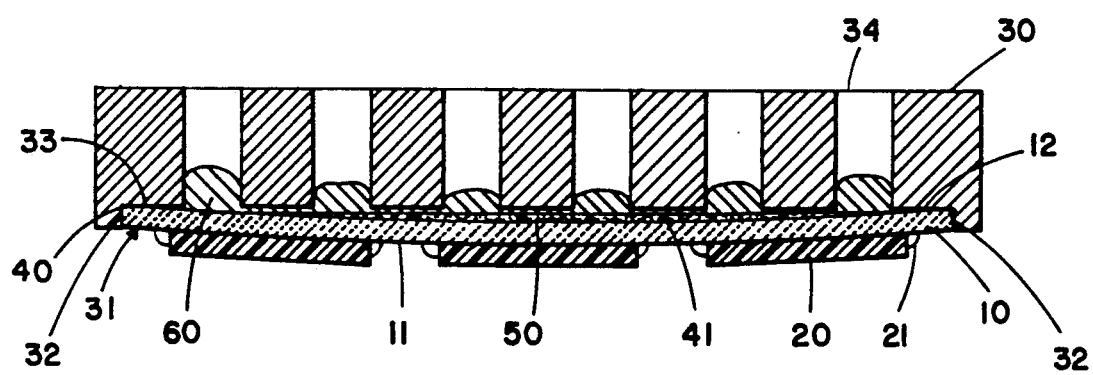
FIG. 3 is a cross-sectional view of the apparatus of FIG. 1 after assembly taken along line 1—1.

Heating the sheet 60 to a temperature above the melting point of the alloy, while under pressure, causes the alloy to reflow and conform to the contours of the domed second surface 12 of the substrate 10, as shown in FIG. 3, reducing the air pocket 41 of FIG. 2. While in its liquid form, the sheet 60 is compressed to a finished thickness in the range of 0.010 to 0.015 inches. The relief 31 provides a means for radially restricting the flow of the alloy while in a liquid state. Excess alloy 60 is forced into the especially provided throughholes 34 of the substrate 10. When the air pocket 41 at the substrate-to-heatsink interface 40 has been reduced, the apparatus is allowed to cool, solidifying the sheet 60. Conventional clamping means, by way of example, plastic snap-ons 80 are placed along the periphery of the apparatus to hold it together during operation. The components 20 can easily be repaired simply by removing the snap-ons 80 and separating the heatsink 30 from the substrate 10.

Figure 4:
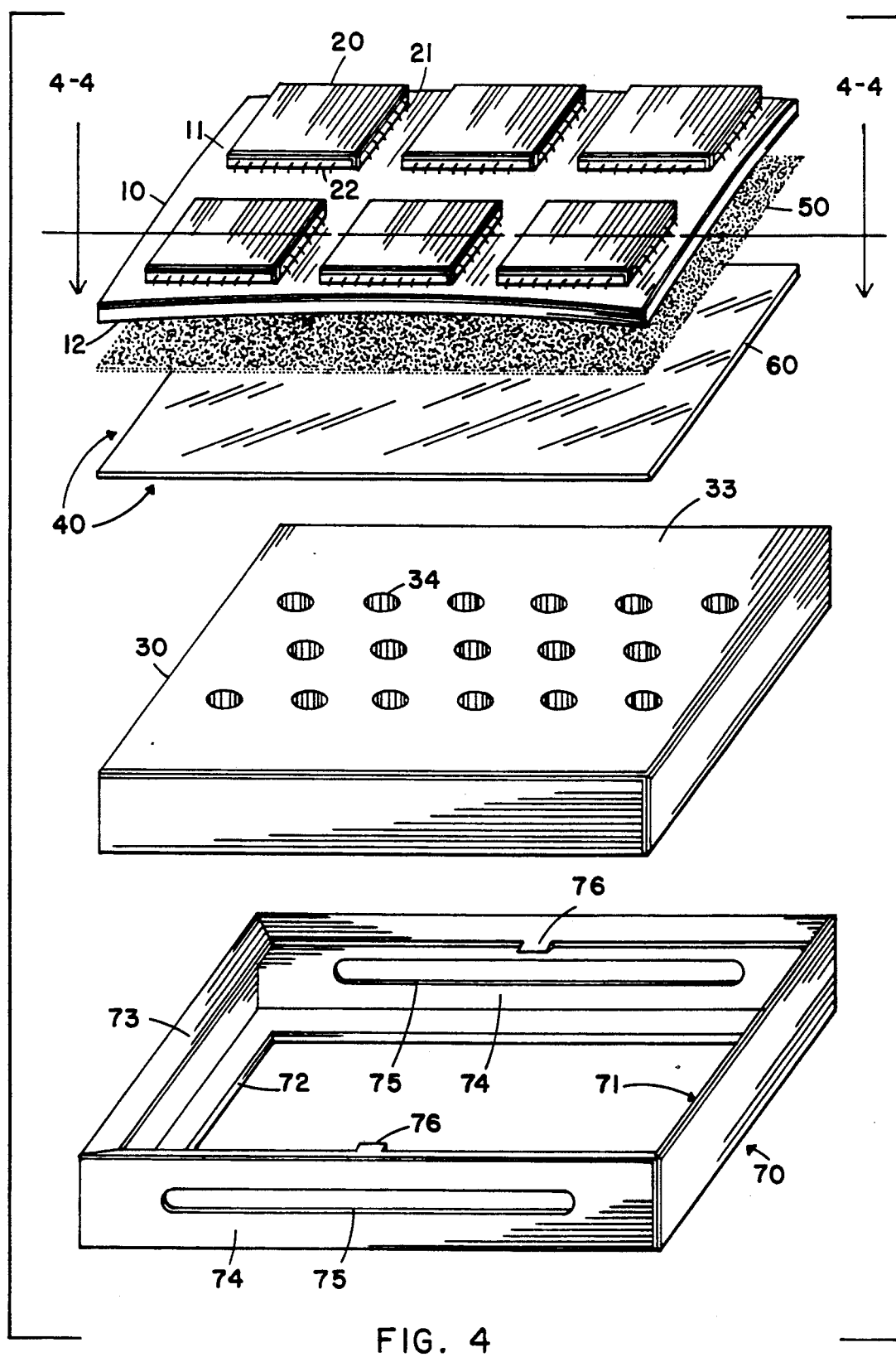
FIG. 4 is an exploded perspective view of an alternative embodiment of the apparatus according to the present invention.

Now with reference to FIG. 4, an alternative embodiment of the apparatus is shown. The heatsink 30 is formed with an essentially planar surface 33, eliminating the step of forming the relief 31 of FIG. 1 during the fabrication of the heatsink 30. In this particular embodiment, the means for radially restricting the sheet 60 during the reflowing step is provided by a rectangularly shaped frame 70 having a central opening 71 therein.

The frame 70 includes a squared lip 72 on one side, and an opposing, inwardly beveled, angular lip 73 with centrally disposed detents 76. The side walls 74 of the frame 70 are provided with an elongated cut-outs 75. The interior lateral extent of the opening 71 is made to substantially conform with the lateral extent of the substrate 10, sheet 60, and heatsink 40, that is, providing a snug fit around the periphery of the components when placed therein. The interior distance between the squared lip 73 and angular lip 74 is made to be equal to the desired finished thickness of the combined substrate 10, sheet 60, and heatsink 30. The frame is made of a flexible material, by way of example, plastic.

Figure 5:
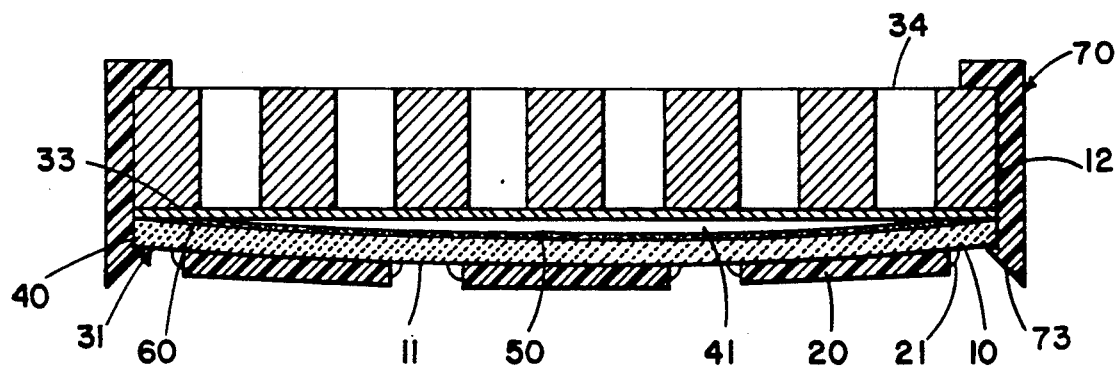
FIG. 5 is a cross-sectional view of the apparatus of FIG. 4 prior to assembly taken along line 4—4.
Figure 6:
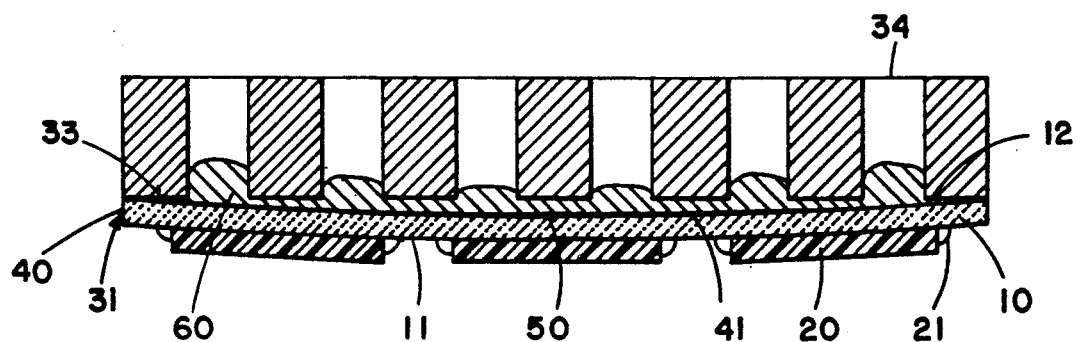
FIG. 6 is a cross-sectional view of the apparatus of FIG. 4 after assembly taken along line 4—4.

During assembly, as shown in FIGS. 5 and 6, after the surface 12 of the substrate 10 is coated with the releasing agent 50, the substrate 10, the sheet 60 and the heatsink 30 are placed inside the opening 71 of the frame 70. The resiliency of the plastic frame 70 combined with the cut-outs 75 permits the insertion of the substrate 10, sheet 60, and heatsink 30 prior to heating, when the total combined thickness of the components is greater than the finished thickness. When the sheet 60 is heated, the frame 70, with assistance from the angular lip 73 and detents 76, compresses the sheet 60, while simultaneously restricting the radial flow of the molten alloy, to reduce the air pocket 41. As in the apparatus of FIG. 1, any excess alloy is forced into throughholes 34. After cooling, the apparatus is removed from the frame 70, and conventional clamping means, such as plastic snap-ons 80 are placed along the periphery of the apparatus to hold it together. The apparatus an easily be repaired by removing the snap-ons 80 to separate the substrate 10 and heatsink 30.

Although the above description has proceeded with reference to an apparatus and method for cooling integrated circuit device mounted on a ceramic substrate, it is to be understood that the apparatus and method as is disclosed herein may be adapted to a wide variety of cooling systems where there is a need to provide a thermally conformal, detachable, and stress free interface between the heat producing device and the heat exchanger, and therefore the invention is not necessarily limited to the particular embodiment shown herein. It is to be understood that various other adaptations and modifications may be made within the spirit and scope of the invention.

What is claimed is:

1. An apparatus for cooling a heat generating device mounted on a substrate comprising:
    a substrate having a first and second surface, the heat generating device being solder-mounted on said first surface via solder connections;
    a first layer of material formed of a releasing agent provided on said second surface of said substrate;
    a second layer of thermally conductive material provided on said first layer, said second layer substantially conforming to said first layer and having a melting point lower than the melting point of said solder connections;
    a heatsink provided on said second layer with said second layer substantially conforming with a surface of said heatsink to further dissipate heat transmitted from said heat generating device through said substrate, said first layer, and said second layer; and
    means for clamping said substrate, said first layer, said second layer, and said heatsink together after said second layer is heated to its melting point, compressed between said substrate and said heatsink for providing a conformal interface between said substrate and said heatsink, and then cooled below its melting point.

2. The apparatus of claim 1 wherein said first layer is formed of a fluoroplastic resin or silicone.

3. The apparatus of claim 1 wherein said second layer is formed of a eutectic metal.

4. The apparatus of claim 3 wherein said eutectic metal includes bismuth and lead.

5. The apparatus of claim 1 wherein said second layer has a thickness in the range of 0.012 to 0.015 inches.

6. The apparatus of claim 1 wherein said substrate is formed of a ceramic material.

7. The apparatus of claim 1 wherein said heatsink is formed of aluminum.

8. The apparatus of claim 1 wherein said heatsink further includes a lateral restraining means for said second layer during assembly of said cooling apparatus.

9. The apparatus of claim 8 wherein said means for laterally restraining said second layer includes a shallow relief with a lateral extent slightly greater than the lateral extent of said substrate.

10. The apparatus of claim 8 wherein said means for laterally restraining includes a rectangular frame.

11. The apparatus of claim 1 wherein said heatsink further includes a plurality of throughholes.

12. A method for making a cooling apparatus for a heat generating device mounted on a first surface of a substrate via solder connections comprising the steps of:
    spraying a first layer of material formed of a releasing agent on a second surface of said substrate;
    placing a second layer of thermally conductive material on said first layer;
    heating said second layer to a temperature above its melting point but below the melting point of said solder connections;
    compressing said second layer between said substrate and a heatsink while restricting its lateral flow and permitting said second layer to substantially conform to the second surface of said substrate and a surface of said heatsink;
    cooling said second layer to a temperature below its melting point; and
    clamping said substrate, said first layer, said second layer, and said heatsink to one and another.

13. The method of claim 12 further including the step of forming a shallow relief in said heatsink.

14. The method of claim 13 further including the step of providing throughholes in said heatsink for excessive quantities of said second layer when said second layer is heated, compressed, and laterally restrained.

15. An apparatus to cool a device comprising:
a substrate having said device soldered by a first solder to a first surface, said solder having a first melting temperature;
a material to which solder does not stick placed on a second surface of said substrate;
a second solder, placed as a layer in contact with said material, said second solder having a second melting temperature lower than said first melting temperature of said first solder; and
a heatsink placed in contact with said layer of said second solder forming a layer conforming with said second surface of said substrate and said heatsink after said apparatus is heated to a temperature above said second melting temperature and below said first melting temperature.

16. The apparatus of claim 15 further comprising:
clamping means to hold said apparatus together.

* * * * *